United States Patent
Kwon et al.

(10) Patent No.: US 9,561,959 B2
(45) Date of Patent: Feb. 7, 2017

(54) COMPOUND SEMICONDUCTORS AND THEIR APPLICATIONS

(71) Applicant: LG CHEM, LTD., Seoul (KR)

(72) Inventors: O-Jong Kwon, Daejeon (KR);
Tae-Hoon Kim, Daejeon (KR);
Cheol-Hee Park, Daejeon (KR);
Kyung-Moon Ko, Daejeon (KR);
Chan-Yeup Chung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/442,085

(22) PCT Filed: Oct. 6, 2014

(86) PCT No.: PCT/KR2014/009386
§ 371 (c)(1),
(2) Date: May 11, 2015

(87) PCT Pub. No.: WO2015/050420
PCT Pub. Date: Apr. 9, 2015

(65) Prior Publication Data
US 2016/0204327 A1    Jul. 14, 2016

(30) Foreign Application Priority Data

Oct. 4, 2013  (KR) .................. 10-2013-0118771
Oct. 6, 2014  (KR) .................. 10-2014-0134340

(51) Int. Cl.
*H01L 35/16*   (2006.01)
*H01L 35/34*   (2006.01)
(Continued)

(52) U.S. Cl.
CPC ......... *C01B 19/002* (2013.01); *H01L 31/0272* (2013.01); *H01L 35/16* (2013.01);
(Continued)

(58) Field of Classification Search
None
See application file for complete search history.

(56) References Cited

U.S. PATENT DOCUMENTS 8,226,843 B2 * 7/2012 Park .................. C09K 11/881
                                                  136/240
2006/0225782 A1 * 10/2006 Berke .................. B82Y 10/00
                                                  136/252
(Continued)

FOREIGN PATENT DOCUMENTS

EP    2 242 121 A1   10/2010
JP    2013-197460 A   9/2013
(Continued)

OTHER PUBLICATIONS

Copending U.S. Appl. No. 15/039,020.*
(Continued)

*Primary Examiner* — Harold Pyon
*Assistant Examiner* — Katie L Hammer

(57) ABSTRACT

Disclosed is a new compound semiconductor material which may be used for thermoelectric material or the like, and its applications. The compound semiconductor may be represented by Chemical Formula 1 below: Chemical Formula 1 $Bi_{1-x}M_xCu_{1-w}T_wO_{a-y}Q1_yTe_bSe_z$ where, in Chemical Formula 1, M is at least one selected from the group consisting of Ba, Sr, Ca, Mg, Cs, K, Na, Cd, Hg, Sn, Pb, Mn, Ga, In, Tl, As and Sb, Q1 is at least one selected from the group consisting of S, Se, As and Sb, T is at least one selected from the group consisting of transition metal elements, $0 \le x < 1$, $0 < w < 1$, $0.2 < a < 1.5$, $0 \le y < 1.5$, $0 \le b < 1.5$ and $0 \le z < 1.5$.

16 Claims, 2 Drawing Sheets

(51) Int. Cl.
    *H01L 31/0272*    (2006.01)
    *C01B 19/00*    (2006.01)
    *H01L 35/18*    (2006.01)

(52) U.S. Cl.
    CPC .......... *H01L 35/34* (2013.01); *C01P 2006/40* (2013.01); *H01L 35/18* (2013.01)

(56) References Cited

U.S. PATENT DOCUMENTS

| | | | | |
|---|---|---|---|---|
| 2006/0283494 | A1* | 12/2006 | Sakai | H01L 35/22 136/238 |
| 2007/0144573 | A1* | 6/2007 | Mihara | C03C 17/23 136/205 |
| 2009/0084422 | A1 | 4/2009 | Haass | |
| 2010/0051081 | A1 | 3/2010 | Iida et al. | |
| 2010/0258184 | A1 | 10/2010 | Laughlin et al. | |
| 2011/0017935 | A1* | 1/2011 | Sohn et al. | C09K 11/881 252/62.3 T |
| 2011/0079751 | A1* | 4/2011 | Park | C09K 11/881 252/71 |
| 2012/0318352 | A1 | 12/2012 | Korevaar | |

FOREIGN PATENT DOCUMENTS

| | | |
|---|---|---|
| KR | 10-2009-0107491 A | 10/2009 |
| KR | 10-2010-0027081 A | 3/2010 |
| WO | WO 2007/104601 A2 | 9/2007 |
| WO | WO 2009/094571 A2 | 7/2009 |
| WO | WO 2010/024500 A1 | 3/2010 |

OTHER PUBLICATIONS

International search report for PCT/KR2014/009386 filed on Oct. 6, 2014.

Extended European Search Report for European Application No. 14850400.4 dated Jun. 21, 2016.

* cited by examiner

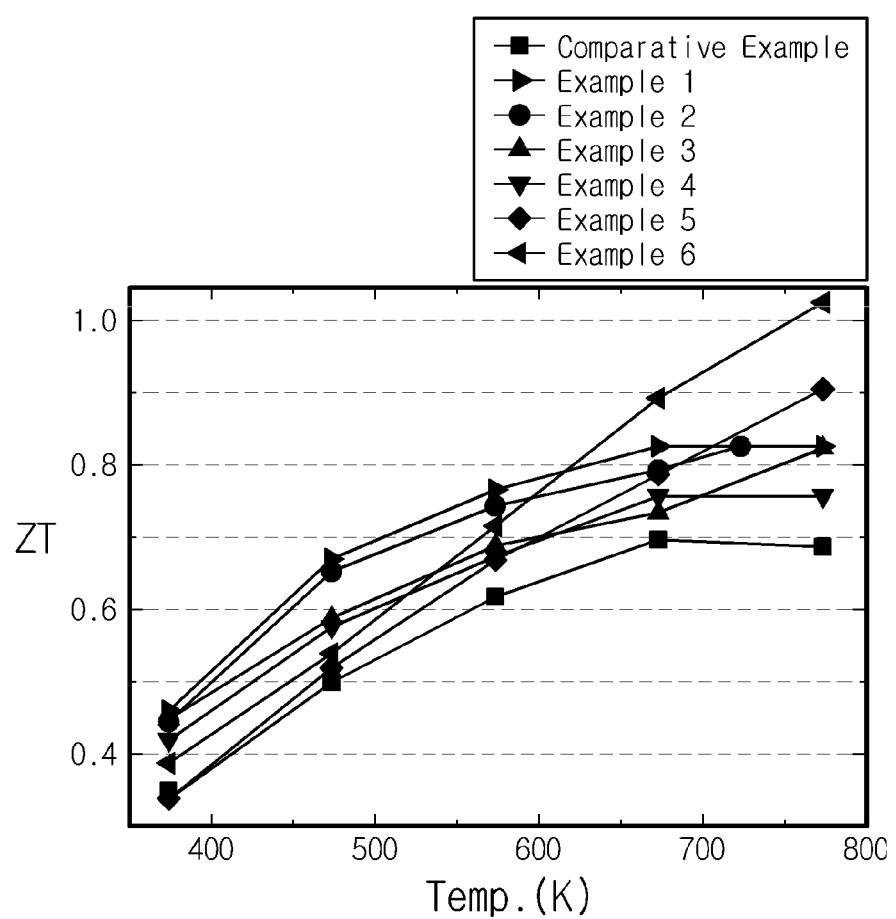

COMPOUND SEMICONDUCTORS AND THEIR APPLICATIONS

TECHNICAL FIELD

The present disclosure relates to a new compound semiconductor material which may be used for various purposes such as thermoelectric material, solar cells or the like, its manufacturing method, and its applications.

The present application claims priority to Korean Patent Application No. 10-2013-0118771 filed on Oct. 4, 2013 and Korean Patent Application No. 10-2014-0134340 filed on Oct. 6, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion devices using the Peltier Effect, light emitting devices using the photoelectric conversion effect, for example, light emitting diodes or laser diodes, solar cells, and the like.

First, a solar cell is environment-friendly since it does not need an energy source other than solar rays, and therefore are actively studied as an alternative future energy source. A solar cell may be generally classified as a silicon solar cell using a single element of silicon, a compound semiconductor solar cell using a compound semiconductor, and a tandem solar cell where at least two solar cells having different band gap energies are stacked.

Among these, a compound semiconductor solar cell uses a compound semiconductor in a light absorption layer which absorbs solar rays and generates an electron-hole pair, and may particularly use compound semiconductors in the III-V groups such as GaAs, InP, GaAlAs and GaInAs, compound semiconductors in the II-VI groups such as CdS, CdTe and ZnS, and compound semiconductors in the I-III-VI groups represented by $CuInSe_2$.

The light absorption layer of the solar cell demands excellent long-term electric and optical stability, high photoelectric conversion efficiency, and easy control of the band gap energy or conductivity by composition change or doping. In addition, conditions such as production cost and yield should also be met for practical use. However, many conventional compound semiconductors fail to meet all of these conditions at once.

In addition, a thermoelectric conversion device is used for thermoelectric conversion power generation or thermoelectric conversion cooling applications, and generally includes an N-type thermoelectric semiconductor and a P-type thermoelectric semiconductor electrically connected in series and thermally connected in parallel. The thermoelectric conversion power generation is a method which generates power by converting thermal energy to electrical energy using a thermoelectromotive force generated by creating a temperature difference in a thermoelectric conversion device. Also, the thermoelectric conversion cooling is a method which produces cooling by converting electrical energy to thermal energy using an effect that a temperature difference creates between both ends of a thermoelectric conversion device when a direct current flows through the both ends of the thermoelectric conversion device.

The energy conversion efficiency of the thermoelectric conversion device generally depends on a performance index value or ZT of a thermoelectric conversion material. Here, the ZT may be determined based on the Seebeck coefficient, electrical conductivity, and thermal conductivity, and as a ZT value increases, a thermoelectric conversion material has better performance.

Heretofore, many kinds of thermoelectric conversion materials have been proposed, but there is substantially no thermoelectric conversion material with sufficiently high thermoelectric conversion performance. In particular, thermoelectric conversion materials are applied to more and more fields, and temperature conditions may vary depending on their applied fields. However, since thermoelectric conversion materials may have different thermoelectric conversion performance depending on temperature, each thermoelectric conversion material needs to have optimized thermoelectric conversion performance suitable for its applied field. However, there is not yet proposed a thermoelectric conversion material with optimized performance for various temperature ranges.

DISCLOSURE

Technical Problem

The present disclosure is designed to solve the above problem, and therefore, the present disclosure is directed to providing a compound semiconductor material having excellent thermoelectric conversion performance, which may be utilized for various purposes such as thermoelectric conversion material of a thermoelectric conversion device, a solar cell or the like, its manufacturing method, and a thermoelectric conversion device or a solar cell using the same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect, after repeated studies of a compound semiconductor, inventors of the present disclosure have successfully synthesized a compound semiconductor represented by Chemical Formula 1, and found that this compound can be used for a thermoelectric conversion material of a thermoelectric conversion device or a light absorption layer of a solar cell.

$Bi_{1-x}M_xCu_{1-w}T_wO_{a-y}Q1_yTe_bSe_z$ <span style="float:right">Chemical Formula 1</span> where, in Chemical Formula 1, M is at least one selected from the group consisting of Ba, Sr, Ca, Mg, Cs, K, Na, Cd, Hg, Sn, Pb, Mn, Ga, In, Tl, As and Sb, Q1 is at least one selected from the group consisting of S, Se, As and Sb, T is at least one selected from the group consisting of transition metal elements, $0 \le x < 1$, $0 < w < 1$, $0.2 < a < 1.5$, $0 \le y < 1.5$, $0 \le b < 1.5$ and $0 \le z < 1.5$.

Here, in Chemical Formula 1, T may include at least one element of transition metal elements, in which an energy level of a d orbital may be within 10 eV around the Fermi level when being substituted for a Cu site, for example Co, Ag, Zn, Ni, Fe and Cr.

In addition, in Chemical Formula 1, w may satisfy the condition of 0<w<0.05.

In addition, in Chemical Formula 1, x, y and z may satisfy the conditions of x=0, y=0 and z=0, respectively.

In addition, Chemical Formula 1 may be represented by $BiCu_{1-w}Co_wOTe$.

In addition, in Chemical Formula 1, M may be Pb, and y, b and z may satisfy the conditions of y=0, b=0 and z=1, respectively.

In addition, Chemical Formula 1 may be represented by $Bi_{1-x}Pb_xCu_{1-w}Co_wOSe$.

In addition, the compound semiconductor according to the present disclosure may have a power factor of 5.0 $\mu W/cmK^2$ or above under a temperature condition of 300K to 800K.

In another aspect, the present disclosure may also provide a method for manufacturing a compound semiconductor, which includes forming a mixture by mixing powder of $Bi_2O_3$, Bi and Cu, powder of at least one selected from the group consisting of Te, S, Se, As, Sb and oxides thereof, and powder of at least one selected from the group consisting of transition metal elements and oxides thereof, and optionally further mixing powder of at least one selected from the group consisting of Ba, Sr, Ca, Mg, Cs, K, Na, Cd, Hg, Sn, Pb, Mn, Ga, In, Tl, As, Sb and oxides thereof; and pressure-sintering the mixture.

Preferably, the transition metal elements mixed in the mixture forming step may include Co, Ag, Zn, Ni, Fe and Cr.

Also preferably, the above method may further include thermally treating the mixture, before the pressure sintering step.

Further preferably, the thermal treatment step may be performed by means of solid-state reaction.

Also preferably, the pressure sintering step may be performed by means of spark plasma sintering or hot pressing.

In another aspect, the present disclosure also provides a thermoelectric conversion device, which includes the compound semiconductor as above.

In another aspect, the present disclosure also provides a solar cell, which includes the compound semiconductor as above.

In another aspect, the present disclosure also provides a bulk-type thermoelectric material, which includes the compound semiconductor as above.

Advantageous Effects

According to the present disclosure, a compound semiconductor material which may be used for a thermoelectric conversion device or a solar cell is provided.

In particular, the new compound semiconductor according to the present disclosure may replace a conventional compound semiconductor or may be used as another material in addition to the conventional compound semiconductor.

In addition, according to an embodiment of the present disclosure, the compound semiconductor may be used as a thermoelectric conversion material of a thermoelectric conversion device. In this case, a high ZT value is ensured, and thus a thermoelectric conversion device with excellent thermoelectric conversion performance may be manufactured. Further, in the present disclosure, a thermoelectric conversion material with a high ZT value in a temperature range of 100° C. to 500° C. may be provided, and thus this may be more usefully applied to a thermoelectric conversion device for medium and high temperature.

In particular, the compound semiconductor according to the present disclosure may be used as a P-type thermoelectric conversion material.

In addition, in another aspect of the present disclosure, the compound semiconductor may be used for a solar cell. Particularly, the compound semiconductor of the present disclosure may be used as a light absorption layer of the solar cell.

Moreover, in another aspect of the present disclosure, the compound semiconductor may be used for an IR window which selectively passes IR, an IR sensor, a magnetic device, a memory or the like.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

FIG. 2 is a graph showing ZT values according to a temperature change of compound semiconductors according to the example according to the present disclosure and the comparative example.

BEST MODE

Figure 1:
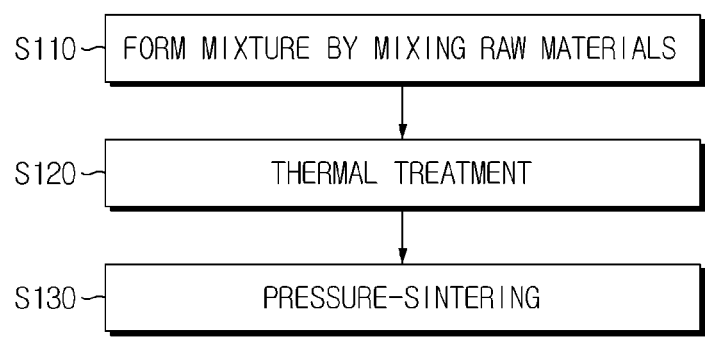
FIG. 1 is a flowchart for schematically illustrating a method for manufacturing a compound semiconductor according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

The present disclosure provides a new compound semiconductor represented by Chemical Formula 1 below.

$$Bi_{1-x}M_xCu_{1-w}T_wO_{a-y}Q1_yTe_bSe_z \qquad \text{Chemical Formula 1}$$

where, in Chemical Formula 1, M is at least one selected from the group consisting of Ba, Sr, Ca, Mg, Cs, K, Na, Cd, Hg, Sn, Pb, Mn, Ga, In, Tl, As and Sb, Q1 is at least one selected from the group consisting of S, Se, As and Sb, T is at least one selected from the group consisting of transition metal elements, 0≤x<1, 0<w<1, 0.2<a<1.5, 0≤y<1.5, 0≤b<1.5 and 0≤z<1.5.

In particular, in the compound semiconductor according to the present disclosure, with respect to a compound semiconductor represented by $Bi_{1-x}M_xCuO_{a-y}Q1_yTe_bSe_z$, Cu sites are partially substituted with a transition metal element. In addition, such a structural characteristic, the compound semiconductor according to the present disclosure may have improved thermoelectric conversion performance in comparison to compound semiconductors represented by $Bi_{1-x}M_xCuO_{a-y}Q1_yTe_bSe_z$, for example BiCuOTe or BiCuOSe. In more detail, if transition metals which partially substitute for Cu sites have an energy level of a d orbital which is within several eV around the Fermi level, a density of state and entropy increase around the Fermi level, and thus a Seebeck coefficient of the compound semiconductor may increase. At this time, if the energy level of the d orbital of the transition metal is closer to the Fermi level, the Seebeck coefficient is improved further. In addition, a carrier concentration of the compound semiconductor may be adjusted depending on the kind of a selected transition metal. In addition, the transition element may deteriorate thermal conductivity of the compound semiconductor by improving a phonon scattering level as a point defect. As described above, the compound semiconductor represented by $Bi_{1-x}M_xCu_{1-w}T_wO_{a-y}Q1_yTe_bSe_z$ in which Cu sites are partially substituted with transition metals may have an improved ZT, which is a thermoelectric performance index, due to the increase of a Seebeck coefficient, control of a carrier concentration, and deterioration of thermal conductivity.

Preferably, the transition metal element for substituting for Cu in the compound semiconductor according to the present disclosure may be selected from elements in which an energy level of the d orbital of a transition element is within 10 eV around the Fermi level when the transition metal element substitutes for a Cu site. For example, in the compound semiconductor according to the present disclosure, Cu is partially substituted with at least one of Co, Ag, Zn, Ni, Fe and Cr, which improves thermoelectric conversion performance. In particular, in the compound semiconductor according to the present disclosure, Cu may be partially substituted with at least one of Ag, Zn and Cr.

Also preferably, in Chemical Formula 1, w may satisfy the condition of $0<w<0.05$. If the transition metal substituting for a Cu site has an amount of $w>0.05$, the compound semiconductor may suffer from uneasy phase synthesis or deteriorated thermoelectric performance, or an undesired secondary phase may be generated.

For example, in Chemical Formula 1, w may be 0.03. In other words, when the compound semiconductor according to the present disclosure is a compound semiconductor represented by $Bi_{1-x}M_xCuO_{a-y}Q1_yTe_bSe_z$, 3% of Cu sites may be substituted with a transition metal element such as Co.

In addition, in Chemical Formula 1, x, y and z may satisfy the conditions of x=0, y=0, z=0. In this case, Chemical Formula 1 may be expressed as a following chemical formula.

$BiCu_{1-w}T_wO_aTe_b$

Further, in the chemical formula, a and b may satisfy the conditions of a=1, b=1. In this case, Chemical Formula 1 may be expressed as a following chemical formula.

$BiCu_{1-w}T_wOTe$

Here, if T is Co, the chemical formula may also be expressed as a following chemical formula.

$BiCu_{1-w}Co_wOTe$

In addition, in Chemical Formula 1, M may be Pb, and x, y and b may satisfy the conditions of x=0.05, y=0, b=0, respectively. In this case, Chemical Formula 1 may be expressed as a following chemical formula.

$Bi_{0.95}Pb_{0.05}Cu_{1-w}T_wO_aSe_z$

Further, in the chemical formula, a and z may satisfy the conditions of a=0.98, z=1. In this case, Chemical Formula 1 may be expressed as a following chemical formula.

$Bi_{0.95}Pb_{0.05}Cu_{1-w}T_wO_{0.98}Se$

Here, if T is Ag, the chemical formula may be expressed as a following chemical formula.

$Bi_{0.95}Pb_{0.05}Cu_{1-w}Ag_wO_{0.98}Se$

In addition, in Chemical Formula 1, M may be Pb, and y, b and z may satisfy the conditions of y=0, b=0 and z=1, respectively. In this case, Chemical Formula 1 may be expressed as a following chemical formula.

$Bi_{1-x}Pb_xCu_{1-w}T_wO_aSe$

Here, if T is Co and a satisfies a condition of a=0.98, Chemical Formula 1 may be expressed as a following chemical formula.

$Bi_{1-x}Pb_xCu_{1-w}Co_wO_{0.98}Se$

In addition, the compound semiconductor according to the present disclosure may include O, and O may be at least partially substituted with another element (Q1). In other words, in Chemical Formula 1, y may satisfy a condition of $0<y$. In particular, Q1 which is substituted with O may be at least one of S, As and Sb.

In addition, the compound semiconductor according to the present disclosure must include Bi. At this time, Bi sites may be partially substituted with another element (M). In other words, in Chemical Formula 1, x may satisfy a condition of $0<x$. In particular, M which is substituted with Bi may be at least one of Cs, K, Na, Cd, Hg, Sn, Pb, Mn, Ga, In, Tl, As and Sb.

As described above, the compound semiconductor according to the present disclosure may be configured so that in a BiCuOTe-based material or BiCuOSe-based material, Cu is partially substituted with a transition metal element such as Co or Ag. In addition, due to such a structural characteristic, the compound semiconductor according to the present disclosure may have a higher ZT value in comparison to a compound semiconductor composed of only BiCuOTe or BiCuOSe, and the thermoelectric conversion performance may be effectively improved.

FIG. 1 is a flowchart for schematically illustrating a method for manufacturing a compound semiconductor according to an embodiment of the present disclosure.

Referring to FIG. 1, a method for manufacturing a compound semiconductor according to the present disclosure may include forming a mixture by mixing raw materials of Chemical Formula 1 (S110), and pressure-sintering the mixture (S130).

Here, in Step S110, as raw materials of Chemical Formula 1, powder of $Bi_2O_3$, Bi and Cu, powder of at least one selected from the group consisting of Te, S, Se, As, Sb and oxides thereof, and powder of at least one selected from the group consisting of transition metal elements and oxides thereof may be mixed.

Preferably, the transition metal elements mixed in Step S110 may include Co, Ag, Zn, Ni, Fe and Cr.

In addition, in Step S110, powder of at least one selected from the group consisting of Ba, Sr, Ca, Mg, Cs, K, Na, Cd, Hg, Sn, Pb, Mn, Ga, In, Tl, As, Sb and oxides thereof may be further mixed optionally to form the mixture.

Preferably, Step S130 may be performed by means of spark plasma sintering (SPS) or hot pressing (HP). The compound semiconductor according to the present disclosure may easily obtain a high sintering density and result electric conductivity when being sintered by means of such a pressure-sintering method.

The pressure sintering step S130 may be performed under a pressure condition of 30 MPa to 200 MPa. In addition, the pressure sintering step S130 may be performed under a temperature condition of 400° C. to 650° C.

Also preferably, as shown in FIG. 1, the method for manufacturing a compound semiconductor according to the present disclosure may further include thermally treating the mixture S120, before pressure-sintering the mixture. The thermal treatment step S120 may facilitate easier reaction among elements included in the mixture. At this time, the thermal treatment step S120 may be performed in a temperature range of 400° C. to 650° C. for 1 hour to 24 hours.

Here, the thermal treatment step S120 may be performed by means of solid state reaction (SSR). Even though the thermoelectric material has the same composition, its thermoelectric performance may vary depending on a thermal treatment method. In the compound semiconductor according to the present disclosure, when materials are reacted by means of SSR, the manufactured compound semiconductor may have more improved thermoelectric performance in comparison to the cases using other methods, such as melting.

The compound semiconductor may have different thermoelectric performance depending on its manufacturing method, and the compound semiconductor according to the present disclosure may be manufactured using the above compound semiconductor manufacturing method. In this case, the compound semiconductor may ensure a high ZT value, and particularly it is advantageous to ensure a high ZT value in a temperature range of 100° C. to 500° C.

However, the present disclosure is not limited to the above, and the compound semiconductor of Chemical Formula 1 may also be manufactured using another method.

A thermoelectric conversion device according to the present disclosure may include the compound semiconductor described above. In other words, the compound semiconductor according to the present disclosure may be used as a thermoelectric conversion material for the thermoelectric conversion device. Particularly, the thermoelectric conversion device according to the present disclosure may include the above compound semiconductor as a P-type thermoelectric material.

The compound semiconductor according to the present disclosure has a large ZT value, which is a performance index of the thermoelectric conversion material. In addition, due to low thermal conductivity, a high Seebeck coefficient and high electric conductivity, the compound semiconductor has excellent thermoelectric conversion performance. Therefore, the compound semiconductor according to the present disclosure may replace a conventional thermoelectric conversion material or may be used for a thermoelectric conversion device in addition to the conventional compound semiconductor.

In addition, the compound semiconductor according to the present disclosure may be applied to a bulk-type thermoelectric conversion material. In other words, the bulk-type thermoelectric material according to the present disclosure includes the compound semiconductor described above.

In addition, a solar cell according to the present disclosure may include the compound semiconductor above. In other words, the compound semiconductor according to the present disclosure may be used for a solar cell, particularly as a light absorption layer of the solar cell.

The solar cell may be produced in a structure where a front surface transparent electrode, a buffer layer, a light absorption layer, a rear surface electrode and a substrate are laminated in order from the side where a solar ray is incident. The substrate located at the lowest portion may be made of glass, and the rear surface electrode on the entire surface thereof may be formed by depositing metal such as Mo.

Subsequently, the compound semiconductor according to the present disclosure may be laminated on the rear surface electrode by means of an electron beam deposition method, a sol-gel method, or a PLD (Pulsed Laser Deposition) to form the light absorption layer. On the light absorption layer, a buffer layer for buffering the difference in lattice constants and band gaps between a ZnO layer serving as the front surface transparent electrode and the light absorption layer may be present. The buffer layer may be formed by depositing a material such as CdS by means of CBD (Chemical Bath Deposition) or the like. Next, the front surface transparent electrode may be formed on the buffer layer by means of sputtering or the like as a ZnO film or a ZnO and ITO laminate.

The solar cell according to the present disclosure may be modified in various ways. For example, it is possible to manufacture a tandem solar cell where a solar cell using the compound semiconductor according to the present disclosure as the light absorption layer is laminated. In addition, the solar cell laminated as described above may employ a solar cell using silicon or another known compound semiconductor.

In addition, it is possible to change a band gap of the compound semiconductor according to the present disclosure and laminate a plurality of solar cells which use compound semiconductors having different band gaps as the light absorption layer. The band gap of the compound semiconductor according to the present disclosure may be adjusted by changing a composition ratio of a component of the compound, for example Te.

In addition, the compound semiconductor according to the present disclosure may also be applied to IR windows which selectively pass IR or IR sensors.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Comparative Example 1

In order to compose BiCuOTe, 21.7 g of $Bi_2O_3$ (Aldrich, 99.9%, 10 um), 9.7 g of Bi (5N+, 99.999%, shot), 8.9 g of Cu (Aldrich, 99.7%, 3 um), and 17.8 g of Te (5N+, 99.999%, shot) were sufficiently mixed using an agate mortar. The mixed materials were put into a silica tube and vacuum-sealed, and then heated at 500° C. for 12 hours, thereby obtaining BiCuOTe powder. After analyzing an x-ray diffraction pattern of the thermally treated specimen, it was found that the material obtained according to Comparative Example 1 is BiCuOTe.

Comparative Examples 2 to 6

Powder of La, $La_2O_3$, SrO, Cu and Se in various amounts was mixed and heated in the same way as in Comparative Example 1. The heating was performed at 800° C. for 12 hours. Chemical formulas of Comparative Examples 2 to 6 may be expressed as follows.

Comparative Example 2: LaCuOSe
Comparative Example 3: $La_{0.95}Sr_{0.05}CuOSe$
Comparative Example 4: $La_{0.90}Sr_{0.10}CuOSe$
Comparative Example 5: $La_{0.85}Sr_{0.15}CuOSe$
Comparative Example 6: $La_{0.80}Sr_{0.20}CuOSe$ Examples 1 to 4

$BiCu_{1-w}T_wOTe$ was composed in the same way as in Comparative Example 1 above, except that powder of each raw material was mixed at a following ratio in order to partially substitute Cu of BiCuOTe with a transition metal (Co, Zn). At this time, Co and Zn powder respectively had purities of 99.0% and 99.9%. In addition, a mixing ratio of each material powder for the composition is listed in Table 1 below (unit: g).

TABLE 1

|  | Example 1 | Example 2 | Example 3 | Example 4 |
|---|---|---|---|---|
| Bi | 0.9720 | 0.9714 | 0.9720 | 0.9721 |
| Cu | 0.8738 | 0.8604 | 0.8598 | 0.8598 |
| $Bi_2O_3$ | 2.1666 | 2.1664 | 2.1660 | 2.1663 |
| Te | 1.7806 | 1.7806 | 1.7797 | 1.7795 |
| Co | 0.0118 | 0.0248 | 0 | 0.0143 |
| Zn | 0 | 0 | 0.0268 | 0.0125 |

Here, the chemical formula of each example may be expressed as follows.

Example 1: $BiCu_{0.085}Co_{0.015}OTe$
Example 2: $BiCu_{0.070}Co_{0.030}OTe$
Example 3: $BiCu_{0.070}Zn_{0.030}OTe$
Example 4: $BiCu_{0.070}Co_{0.015}Zn_{0.015}OTe$ Example 5 and 6

$Bi_{0.95}Pb_{0.05}Cu_{1-w}Ag_wO_aSe$ was composed basically in the same way as in Comparative Example 1 above, except that powder of each raw material was mixed at a following ratio in order to partially substitute Cu of $Bi_{0.95}Pb_{0.05}CuO_aSe$ with Ag. At this time, the Ag powder was 99.9%, 45 um. In addition, a mixing ratio of each material powder for the composition is listed in Table 2 below (unit: g).

TABLE 2

|  | Example 5 | Example 6 |
|---|---|---|
| $Bi_2O_3$ | 2.5891 | 2.5014 |
| Pb | 0.1731 | 0.1709 |
| Bi | 0.9871 | 0.9729 |
| Cu | 1.0270 | 1.0232 |
| Se | 1.3160 | 1.2975 |
| Ag | 0.0540 | 0.0356 |

Here, the chemical formula of each example may be expressed as follows.

Example 5: $Bi_{0.95}Pb_{0.05}Cu_{0.97}Ag_{0.03}OSe$
Example 6: $Bi_{0.95}Pb_{0.05}Cu_{0.98}Ag_{0.02}O_{0.98}Se$ For the compound of each embodiment, x-ray diffraction analysis was performed in the same way as Comparative Example 1 to check the material obtained in each example.

After charging a graphite mold having a diameter of 12 mm partially with each specimen of the above examples and comparative examples, a pressure of 50 MPa was applied thereto by using an SPS. In addition, the compounds of Comparative Example 1 and Examples 1 to 4 were sintered at 500° C. for 5 minutes, the compounds of Comparative Examples 2 to 6 were sintered at 800° C. for 5 minutes, and the compounds of Examples 5 and 6 were sintered at 600° C. for 5 minutes.

Next, for each sintered specimen, electric conductivity and Seebeck coefficient were measured using ZEM-3 (Ulvac-Rico, Inc.) at predetermined temperature intervals to calculate a power factor (PF), and thermal conductivity of each specimen was measured using LFA457 (Netch). After that, by using the obtained measurement values, a thermoelectric performance index (ZT) of each specimen was checked.

Here, the measured electric conductivity, Seebeck coefficient and thermal conductivity and the checked ZT value for Comparative Example 1 are shown in Table 3 below. In addition, the measurement results of electric conductivity, Seebeck coefficient and power factor measured at 300K and/or 673K for Comparative Examples 2 to 6 are also shown in Table 4. In addition, the measured electric conductivity, Seebeck coefficient and thermal conductivity and the checked ZT for Examples 1 to 6 are shown in Tables 5 to 10.

TABLE 3

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 373.85 | 183 | 196 | 7.03 | 0.747 | 0.35 |
| 473.75 | 171 | 203 | 7.05 | 0.664 | 0.50 |
| 573.85 | 187 | 196 | 7.16 | 0.664 | 0.62 |
| 673.95 | 208 | 187 | 7.28 | 0.706 | 0.70 |
| 773.85 | 195 | 185 | 6.67 | 0.753 | 0.69 |

TABLE 4

|  | Electrical conductivity (S/cm) at 300 K | Seebeck coefficient (μV/K) at 300 K | Power Factor (μW/cmK$^2$) at 300 K | Power Factor (μW/cmK$^2$) at 673 K |
|---|---|---|---|---|
| Comparative Example 2 | 0.6 | 121.5 | 0 | 0.1 |
| Comparative Example 3 | 74.7 | 128.0 | 1.2 | 1.3 |
| Comparative Example 4 | 82.9 | 120.7 | 1.2 | 0.9 |
| Comparative Example 5 | 58.8 | 100.6 | 0.6 | 1.0 |
| Comparative Example 6 | 43.9 | 95.3 | 0.4 | 0.8 |

TABLE 5

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 323.75 | 205 | 197 | 7.98 | 0.657 | 0.39 |
| 373.65 | 195 | 195 | 7.40 | 0.597 | 0.46 |
| 473.65 | 217 | 192 | 7.98 | 0.567 | 0.67 |
| 573.75 | 175 | 205 | 7.33 | 0.545 | 0.77 |
| 673.95 | 178 | 197 | 6.87 | 0.561 | 0.83 |
| 773.95 | 166 | 194 | 6.24 | 0.584 | 0.83 |

TABLE 6

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 373.55 | 187 | 195 | 7.12 | 0.588 | 0.45 |
| 473.65 | 206 | 191 | 7.49 | 0.540 | 0.66 |
| 573.75 | 175 | 199 | 6.93 | 0.532 | 0.75 |
| 673.95 | 174 | 194 | 6.52 | 0.548 | 0.80 |
| 723.15 | 180 | 189 | 6.41 | 0.556 | 0.83 |

TABLE 7

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 323.75 | 224 | 195 | 8.47 | 0.696 | 0.39 |
| 373.75 | 192 | 199 | 7.61 | 0.627 | 0.45 |
| 473.75 | 209 | 192 | 7.72 | 0.617 | 0.59 |
| 573.85 | 173 | 203 | 7.15 | 0.594 | 0.69 |
| 673.95 | 175 | 197 | 6.77 | 0.614 | 0.74 |
| 773.95 | 190 | 186 | 6.54 | 0.609 | 0.83 |

TABLE 8

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 322.85 | 208 | 189 | 7.46 | 0.690 | 0.35 |
| 373.75 | 188 | 191 | 6.88 | 0.617 | 0.42 |
| 473.75 | 187 | 195 | 7.14 | 0.580 | 0.58 |
| 573.85 | 160 | 203 | 6.62 | 0.557 | 0.68 |
| 673.95 | 168 | 196 | 6.48 | 0.578 | 0.76 |
| 773.75 | 159 | 192 | 5.85 | 0.597 | 0.76 |

TABLE 9

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 323.55 | 338 | 140 | 6.60 | 0.830 | 0.26 |
| 373.45 | 298 | 149 | 6.65 | 0.727 | 0.34 |
| 473.65 | 242 | 170 | 7.02 | 0.643 | 0.52 |
| 573.85 | 200 | 185 | 6.83 | 0.589 | 0.67 |
| 673.95 | 169 | 196 | 6.47 | 0.554 | 0.79 |
| 773.95 | 151 | 203 | 6.24 | 0.529 | 0.91 |

TABLE 10

| T (K) | Electrical Conductivity (S/cm) | Seebeck coefficient (μV/K) | Power Factor (μW/cmK$^2$) | Thermal Conductivity (W/mK) | ZT |
|---|---|---|---|---|---|
| 373.65 | 317 | 154 | 7.52 | 0.719 | 0.39 |
| 473.65 | 242 | 172 | 7.16 | 0.623 | 0.54 |
| 573.95 | 196 | 190 | 7.08 | 0.562 | 0.72 |
| 673.95 | 168 | 206 | 7.13 | 0.531 | 0.90 |
| 773.95 | 147 | 213 | 6.69 | 0.505 | 1.03 |

Meanwhile, the measured ZT values for Comparative Example 1 and Examples 1 to 6, shown in Tables 3 and 5, are depicted in FIG. 2 for convenient comparison.

First, referring to Tables 3 and 5 to 10 and FIG. 2, it may be found that in case of the compound semiconductors according to Examples 1 to 6 as shown in Tables 5 to 10, the power factor is greatly improved and the thermal conductivity is greatly deteriorated, in comparison to the compound semiconductor (BiCuOTe) of Comparative Example 1 as shown in Table 3. In addition, from this, it may be understood that the ZT values of the compound semiconductors according to Examples 1 to 6 are greatly improved in comparison to the ZT value of the compound semiconductor of the comparative example.

In particular, referring to FIG. 2, it may be found that the compound semiconductors according to several examples of the present disclosure have improved ZT values in comparison to the compound semiconductor of the comparative example.

For example, in a temperature condition of about 473K, Comparative Example 1 has a ZT value of 0.50, the Examples 1 to 6 have improved ZT values of 0.52 or above, preferably 0.60 or above, more preferably 0.65 or above, which are greater than 0.50. In addition, in a temperature condition of about 573K, Comparative Example 1 has a ZT value of 0.62, but Examples 1 to 6 have ZT values of 0.65 or above, preferably 0.70 or above, more preferably 0.75 or above, greatly different from Comparative Example 1. In addition, in a temperature condition of about 673K, Comparative Example 1 has a ZT value of 0.70, but Examples 1 to 6 have ZT values of 0.74 or above, preferably 0.80 or above, more preferably 0.90 or above, greatly different from Comparative Example 1. In addition, in a temperature condition of about 773K, Comparative Example 1 has a ZT value of 0.69, but Examples 1 to 6 have ZT values of 0.76 or above, preferably 0.80 or above, more preferably 0.9 or above, further preferably 1.9 or above, greatly different from Comparative Example 1.

Next, referring to Tables 4 and 5 to 10, it may be found that in low or middle temperature near 300K or 673K, the compound semiconductors according to Examples 1 to 6 have greatly higher power factors in comparison to the compound semiconductors according to Comparative Examples 2 to 6.

In particular, the compound semiconductor according to an embodiment of the present disclosure may have a power factor of 5.0 μW/cmK$^2$ or above in a temperature range of 300K to 800K.

In more detail, with reference to Tables 5 to 10, the compound semiconductors according to Examples 1 to 6 show a power factor of 5.5 μW/cmK$^2$ or above in the entire temperature range of 300K to 800K.

Further, the compound semiconductor according to an embodiment of the present disclosure may have a power factor of 6.0 μW/cmK$^2$ in a temperature condition of 300K to 800K. In particular, the compound semiconductor according to an embodiment of the present disclosure may have a power factor of 6.5 μW/cmK$^2$ or above, preferably 7.0 μW/cmK$^2$ or above, more preferably 7.5 μW/cmK$^2$ or above in a temperature condition of 300K to 800K.

Meanwhile, in the compound semiconductors according to Comparative Examples 2 to 6, Bi is not included, and Cu is not partially substituted with a transition metal, different from Examples 1 to 6. The semiconductors according to Comparative Examples 2 to 6 have a power factor of just 0.1 to 1.3 μW/cmK$^2$ in a temperature condition of 300K or 673K as shown in Table 4, which is very higher than that of the subject invention.

Therefore, if the comparison results of Examples and Comparative Examples are put into consideration, it may be understood that the compound semiconductor according to the present disclosure has excellent thermoelectric conversion performance.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A compound semiconductor comprising a material represented by Chemical Formula 1 below:

$$Bi_{1-x}M_xCu_{1-w}T_wO_{a-y}Q1_yTe_bSe_z \quad \text{Chemical Formula 1}$$

where, in Chemical Formula 1, M is at least one selected from the group consisting of Ba, Sr, Ca, Mg, Cs, K, Na, Cd, Hg, Sn, Pb, Mn, Ga, In, Tl, As and Sb, Q1 is at least one selected from the group consisting of S, Se, As and Sb, T is at least one selected from the group consisting of transition metal elements and partially substitutes for Cu sites, $0 \leq x < 1$, $0 < w < 1$, $0.2 < a < 1.5$, $0 \leq y < 1.5$, $0 \leq b < 1.5$ and $0 \leq z < 1.5$.

2. The compound semiconductor according to claim 1, wherein, in Chemical Formula 1, T is at least one selected from the group consisting of Co, Ag, Zn, Ni, Fe and Cr.

3. The compound semiconductor according to claim 1, wherein, in Chemical Formula 1, w satisfies the condition of $0 < w < 0.05$.

4. The compound semiconductor according to claim 1, wherein, in Chemical Formula 1, x, y and z satisfy the conditions of x=0, y=0 and z=0, respectively.

5. The compound semiconductor according to claim 1, wherein Chemical Formula 1 is represented by $BiCu_{1-w}Co_wOTe$.

6. The compound semiconductor according to claim 1, wherein, in Chemical Formula 1, M is Pb, and y, b and z satisfy the conditions of y=0, b=0 and z=1, respectively.

7. The compound semiconductor according to claim 1, wherein the compound semiconductor has a power factor of 5.0 μW/cmK² or above under a temperature condition of 300K to 800K.

8. A method for manufacturing a compound semiconductor defined in claim 1, the method comprising:
forming a mixture by mixing powder of $Bi_2O_3$, Bi and Cu, powder of at least one selected from the group consisting of Te, S, Se, As, Sb and oxides thereof, and powder of at least one selected from the group consisting of transition metal elements and oxides thereof, and optionally further mixing powder of at least one selected from the group consisting of Ba, Sr, Ca, Mg, Cs, K, Na, Cd, Hg, Sn, Pb, Mn, Ga, In, Tl, As, Sb and oxides thereof; and
pressure-sintering the mixture.

9. The method for manufacturing a compound semiconductor according to claim 8,
wherein the transition metal elements include Co, Ag, Zn, Ni, Fe and Cr.

10. The method for manufacturing a compound semiconductor according to claim 8, before the pressure sintering step, further comprising:
thermally treating the mixture.

11. The method for manufacturing a compound semiconductor according to claim 10,
wherein the thermal treatment step is performed by means of solid-state reaction.

12. The method for manufacturing a compound semiconductor according to claim 8,
wherein the pressure sintering step is performed by means of spark plasma sintering or hot pressing.

13. A thermoelectric conversion device, which includes the compound semiconductor defined in claim 1.

14. The thermoelectric conversion device according to claim 13,
wherein the compound semiconductor is included as a P-type thermoelectric conversion material.

15. A solar cell, which includes the compound semiconductor defined in claim 1.

16. A bulk-type thermoelectric material, which includes the compound semiconductor defined in claim 1.

* * * * *